United States Patent [19]

Galvagni

[11] Patent Number: 4,903,166
[45] Date of Patent: Feb. 20, 1990

[54] ELECTROSTRICTIVE ACTUATORS

[75] Inventor: John Galvagni, Myrtle Beach, S.C.

[73] Assignee: AVX Corporation, New York, N.Y.

[21] Appl. No.: 363,770

[22] Filed: Jun. 9, 1989

[51] Int. Cl.$^4$ .......................... H01G 4/10; H01G 7/00
[52] U.S. Cl. ...................................... 361/321; 29/25.42
[58] Field of Search ............... 29/25.42; 361/321, 308, 361/309, 310, 306

[56] References Cited

U.S. PATENT DOCUMENTS 2,437,212  3/1948  Schottland .......................... 361/321
4,685,197  8/1987  Tigelaar et al. ..................... 29/25.42

FOREIGN PATENT DOCUMENTS 151529  10/1981  German Democratic Rep. .................................. 361/321

*Primary Examiner*—Donald A. Griffin
*Attorney, Agent, or Firm*—Arthur B. Colvin

[57] ABSTRACT

An improved method of forming electrostrictive actuators or capacitors is disclosed. A stack of green ceramic sheets is formed, a surface of the sheets including areas of electrode forming material and other areas of heat dispersible material. The electrodes of opposite polarity are exposed at opposite surfaces of the stack and areas of dispersible material intervene between the exposed edges of the electrode ink margins. An actuator fabricated in accordance with the method may be terminated without fear of shorting between adjacent layers and the resultant actuator will be essentially free of dielectric bonding whereby, when used as an actuator, a high degree of expansion will be achieved. The invention is further directed to a preform fabricated in accordance with the method of the invention.

6 Claims, 1 Drawing Sheet

ELECTROSTRICTIVE ACTUATORS

BACKGROUND AND FIELD OF THE INVENTION

The present invention is directed to the field of ceramic actuators and capacitors and relates more particularly to a ceramic capacitor or actuator having improved mechanical characteristics, and where used as an actuator having improved expansion characteristics and resistance to breakage after repeated cycles of use. Still more particularly, the invention hereof is directed to a method of manufacturing an actuator or capacitor of the type described. For convenience, the method and article of the instant invention will be referred to as a ceramic actuator or actuators. As used herein, such term is intended to encompass ceramic capacitors.

PRIOR ART

Actuator devices which are comprised of electrostrictive elements are well known in the industry and are used inter alia in printer heads of impact printers, the force generating elements of relays, and as means for deflecting or forming optical surfaces to vary the characteristic thereof. Such actuator devices may take the form of two or more ceramic layers, and generally a multiplicity of such layers, the layers having interspersed therebetween electrode areas. As is conventional, in order to facilitate connection of electrodes of the same polarity without shorting between the electrodes of adjacent layers, it is common practice (for capacitors or actuators) to form a stack of green ceramic sheets wherein the electrode areas of opposite polarities exit at different surfaces of the stack. Thus, in the case of a rectangular shaped actuator, electrodes of a first polarity may be exposed at the left hand side of the stack and intervening electrodes of opposite polarity may exit from the right hand side of the stack. In order to facilitate forming electrical connections between electrodes of the same polarity, it is common practice for the sheet forming the stack to be coated with electroding material such that the electrode area extends to one margin of the stack but terminates short of the opposite margin of the stack. Since the resultant stack exposes electrode of only one polarity at each of the respective two sides, it is possible to apply a conductive termination to entirety of the two sides which termination will make electrical contact with the electrodes which are exposed but which will be isolated from the electrodes of opposite polarity due to the presence of unelectroded ceramic areas intervening between exposed electrodes.

While the described structure represents virtually the entirety of ceramic MLC's used by the industry, devices of the type described incorporate drawbacks especially where used as actuators, i.e. for their electrostrictive property, but also where used in conventional capacitor applications. More particularly, the drawback derives from the fact that the finished actuator includes a ceramic to ceramic bridging connection between adjacent dielectric layers in the areas where there is no intervening electrode material between the layers.

The layer to layer ceramic bonding has been found to drastically restrict or constrain the ability of the ceramic device to expand in a direction perpendicular to the plane of the dielectric layers. In addition, actuators fabricated in accordance with the conventional methods described have evidenced a significant tendency to crack or split after protracted use. The tendency to split is also present in ceramic capacitors not employed as actuators, a tendency which is believed to result from the fact that virtually all ceramic compositions have some degree of electrostrictive property, and thus are subject to dimensional changes when voltages are applied.

In order to avoid the constraining influences of areas of ceramic bridging from layer to layer, while at the same time providing means for terminating the actuator, the prior art has proposed solutions which while effective are difficult to implement on a commercial scale.

U.S. Pat. No. 4,523,121 of June 11, 1985 (Takahashi) describes a multi-layer electrostrictive device capable of enhanced expansion characteristics and of withstanding repeated pulsing. This reference notes the constraining influence of bridging areas of ceramic between dielectric layers and it proposes, as a solution, formation of an essentially conventional electrostrictive device which is modified by cutting away the bridging ceramic areas between adjacent layers as by the use of a diamond cutter, (Column 11 lines 3 and following). The noted reference also suggest forming the basic actuator block with the electrodes of both polarities extending to the extremities of the block, thereafter applying areas of insulation in registry with the edge portions of alternate layers at opposite sides of the block and thereafter forming a termination over the insulating portions.

U.S. Pat. No. 4,681,667 of July 21, 1987 (Utsuni) describes the method of manufacturing an electrostrictive device by forming a monolith of alternate ceramic and electrode layers. Electrodes of a first polarity are electrically connected and the device is immersed in a bath containing charged glass insulating particles which are attracted to the exposed portions of the electrodes remote from the initial connection. The process is repeated with the electrodes of opposite polarity whereby there is formed surfaces at opposite portions of the monolith wherein only electrodes of a given polarity are exposed. Terminations may thereafter be effected to the surfaces without fear of terminating material shorting electrodes of opposite polarities.

As will be evidences from a review of the noted prior art devices, the proposed solutions are of questionable commercial viability. Obviously, in view of the fact that the dielectric layers may be less than a milimeter in thickness and that a large number of layers may be employed in a single actuator the ability to form cuts with a diamond saw or to accurately paint insulation, or to deposit insulating materials, in precise registry with electrodes at opposite sides of the monolith represents a significant investment in labor and results in a substantial cost increase.

Other references found in a search of the prior art and of limited or no relevance include the following U.S. Letters Patent:

| | |
|---|---|
| 4,667,127 | May 19, 1987 |
| 4,654,546 | March 31, 1987 |
| 4,527,082 | July 2, 1985 |
| 3,967,027 | June 29, 1976 |
| 3,943,614 | March 16, 1976 |
| 3,940,974 | March 2, 1976 |
| 3,276,031 | September 27, 1966 |
| 2,478,223 | August 9, 1949 |

SUMMARY OF THE INVENTION

The present invention is directed to a method of manufacturing an actuator device which is free of dielectric to dielectric connection between adjacent layers. The method of the invention provides an economical and commercially feasible means for forming an actuator of the type described wherein electrodes of opposite polarity are exposed at opposite faces of the ceramic monolith whereby a termination may be applied to the entirety of such faces without fear of short circuiting layers of opposite polarity. The method of the present invention, for the first time, describes a practical means of forming a ceramic electrostrictive actuator device wherein a large number of thin dielectric layers are present.

More specifically, the method of the present invention involves providing a number of sheets of "green" ceramic material which are imprinted with a pattern of areas of electrode forming materials and other areas of "pseudo-electrode" forming material. The term "pseudo-electrode" as used herein is intended to refer to a material which adds bulk so as to provide a divider and which is subject to volitilization in the course of fabrication of the ceramic monolith. Pseudo-electrode inks are known per se as, for example, from U.S. Pat. No. 3,679,950.

In accordance with the method of the invention the green ceramic sheets have imprinted thereon, as by silk screening or the like, a metalized ink, i.e. an ink including platinum or palladium particles. The metalized ink extends to at least one margin of the sheet. The remainder of the sheet is imprinted with a pseudo-electrode forming ink, the pseudo-ink extending to at least one other margin of the sheet. A plurality of the sheets of green, imprinted ceramic are stacked in such manner that the edges of the metalized electrode layers of the odd numbered sheets are exposed at a first surface of the stack and the metalized electrode edges of the intervening layers are exposed at a second edge surface of the stack. Between each pair of exposed end portions of the metalized electrodes there is disposed a portion of a sheet having pseudo-electrode materials exposed at the edge and extending a distance inwardly towards the interior of the stack.

Following burn-out and sintering of the stack, the pseudo-electrode material is driven off with the result that the two noted surfaces of the stack are comprised of exposed electrodes of the same polarity with intervening voids in the area previously occupied by the pseudo-electrode material. As a result, a coductive termination may be applied to the noted surfaces, The termination making contact with only electrodes of a given polarity. Since the termination material does not penetrate into the interior of the stack in the areas of the voids, the termination material cannot short circuit to electrodes of opposite polarity. Additionally, since the pseudo-electrode material leaves a void in the area between adjacent dielectric sheets, there is no significant bonding between the sheets whereby the adjacent dielectric layers are fee to expand without interference.

The resulting actuator device will expand by a factor 20% or more times the amount of expansion available if the adjacent layers were in ceramic to ceramic contact.

An important advantage of an actuator or capacitor made by the noted method is that the device is far more resistant to breakage at the cleavage limes between layers. This is so since the unconnected layers are free of the tendency to flex or bend when subjected to applied voltages as is the case with conventional actuators or capacitors wherein the edge portions are bonded together and the central portions, wherein the electrodes are in registry, are free to expand.

The invention is further directed to an article of manufacture comprised of a green ceramic stack formed in accordance with the method hereinabove described.

It is accordingly an object of the invention to provide a method of manufacturing multilayer ceramic actuators and capacitors which are essentially free of ceramic to ceramic connections in adjacent layers and which may be readily terminated by conventional terminating techniques. A further object of the invention is a provision of a method of type described which may be readily practiced on a commercial scale.

DETAILED DESCRIPTION OF PROCESS

Figure 1:
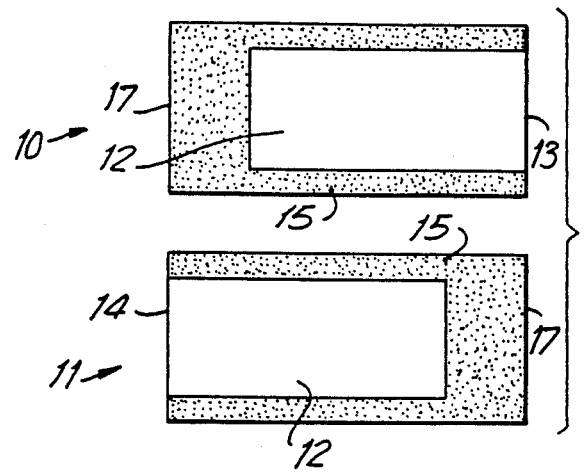
FIG. 1 represents a diagrammatic plan view of a pair of green ceramic sheets coated with a combination of electrode forming ink and pseudo-electrode ink in accordance with the invention.

Referring now to the drawings which are diagrammatic in nature, there is shown in FIG. 1 a pair of green ceramic sheets 10,11 which are essentially identical in size. It will be recognized by those skilled in the art that the sheets 10,11 in commercial practice will comprise segments of a larger sheet or band of green ceramic which sheet or band has been simultaneously imprinted with a multiplicity of printing areas from which sheets such as sheets 10 and 11 are stamped and subsequently stacked.

In accordance with the method of the invention, the sheets are imprinted with an electroding pattern, the area 12 of the sheets being imprinted with a conventional electroding ink more fully described hereinafter, but basically comprising a solvent, a binder, and particulate metal such as platinum, gold, or palladium resistant to the high temperatures of sintering.

As will be apparent, the sheets 10, 11 are identical but have been reversed one with respect to the other. The electrode forming ink component 12 extends to an end margin 13 of the sheet 10 and to the opposite end margin 14 of the sheet 11. As see in FIG. 1, the remaining area of the sheets 10 and 11 surrounding the electrode areas 12 is generally U-shaped as shown at 15, the U-shaped areas 15 being coated by a "pseudo electrode" forming ink composition 16. Suitable pseudo ink formulations are known, i.e. from patents such as U.S. Pat. No. 3,679,950 dealing with the formation of a capacitor by a process of forming voids within a ceramic monolith using pseudo ink, and thereafter filling the voids with molten lead to define electrodes. The pseudo-electrode ink which in general is comprised of organic materials which burn out in a heated environment junction to assure that void areas are present between the ceramic layers after sintering.

While the respective coatings as disclosed in FIG. 1 have been shown as comprising a central area 12 coated with electrode forming ink and a generally U-shaped surrounding area 15 coated by pseudo ink 16, it should be appreciated that the geometry of the coatings may be varied. More particularly, the electrode ink area 12 may extend across the entirety of the sheet rather than being surrounded by a pseudo electrode area which is U-shaped in plan. All that is necessary for the satisfactory exploitation of the method is that the electrode area 12 extend to one margin 13 of the sheets, and that the pseudo electrode area extend to a separate margin, i.e. 17 of the sheets. Alternate geometric arrangements of the electrode ink and pseudo electrode ink may readily suggest themselves to those skilled in the art. By way of example, and without limitation, it would be feasible to form an actuator in the configuration of a cylinder having a through going central aperture. In this configuration the odd numbered sheets may have electrode ink extending from the central aperture toward the circumference but terminating short of the circumference whereas the even numbered sheet would have electrode areas extending from the circumference toward but terminating short of the central aperture. In all cases, the areas of the sheets not covered by electrode ink are covered by pseudo electrode ink.

Figure 2:
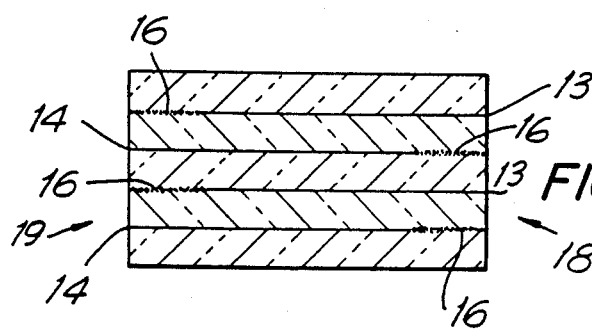
FIG. 2 is a diagrammatic sectional view of a stack of the sheets as shown in FIG. 1.

Returning to the geometry of the illustrated embodiment, there is shown in FIG. 2 a stack of sheets 10 and 11 arranged in such manner that the margins 13 of alternate sheets extend to one end surface 18 and the margin 14 of the sheet intervening between the alternate sheets extend to an the opposite surface of the stack. It will be further observed that the resulting stack includes margins 17 of exposed psuedo-ink disposed between each of the margins 13 or 14 having exposed electrode materials at the respective sides 18 and 19 of the stack.

Figure 3:
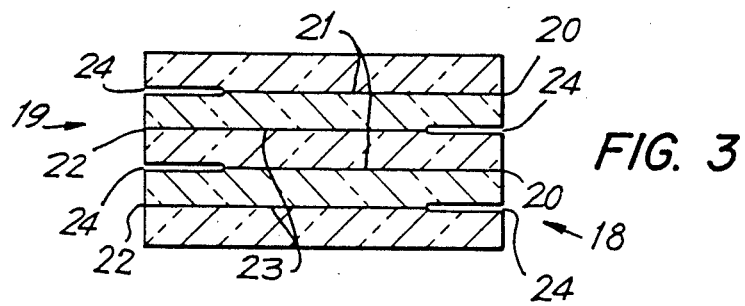
FIG. 3 is a view similar to that of FIG. 2 showing the stack of FIG. 2 after burnout and sintering.

In FIG. 3 there is disclosed the configuration of a finished actuator formed as a result of sintering the green ceramic stack of FIG. 2. As will be apparent from FIG. 3, edge portions 20 of the odd numbered electrodes 21 will be exposed at the end 18 of the actuator and edge portions 22 of the even numbered electrodes 23 will be exposed at the ends 19 of the monolith. Due to the volitilization of the pseudo ink components, void areas 24 will be disposed at the end of the monolith between the exposed ends 20 and 21 of the electrodes.

Figure 4:
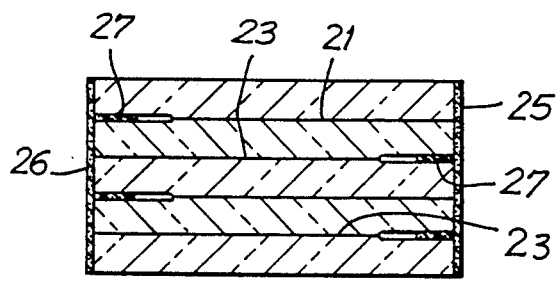
FIG. 4 is a view similar to FIGS. 2 and 3 following application of termination.

As shown in FIG. 4, conductive terminations 25, 26 may accordingly be applied over the respective ends 18,19 of the monolith which terminations will make contact with electrodes of only a single polarity. Thus, the termination 25 connects the odd numbered electodes 21 whereas the termination 26 is connected to the even numbered electrodes 23.

Optionally, the respective sides 18 and 19 of the monolith may be processed to inject insulating materials 27 into the voids 24 before application of the termination. Normally, however, the use of insulating material such as elastomers or epoxies is not necessary due to the depth of the void areas 24.

An important feature of the invention resides in the fact that due to the volitilization of the pseudo electrode forming ink, there is no significant ceramic to ceramic contact between adjacent dielectric layers. The absence of such bridging ceramic contact between layers permits the finished actuator to expand without constraint in a direction perpendicular to the plane of the dielectric and electrodes. It has been experimentally determined that the absence of bridging areas of ceramic between adjacent dielectric surfaces permits an expansion of the actuator by factor of 20% or more greater with the same input voltage voltage than is the case with conventional actuators. A further advantage of actuators fabricated in accordance with the method of the present invention resides in their greater resistance to breakage following repeated pulsing. It is theorized that the increased life cycle of the actuators fabricated in accordance with this invention resides from the fact that the dielectric layers are subjected to minimal flexing or bending in contrast with conventional actuators wherein the edge portions are constrained by ceramic to ceramic contact and the central portions expand upon application of voltages. It should be observed that in the course of the sintering process, it is inherent that an occasional pillar or grain will grow through from one layer to the next even in the areas previously occupied by the pseudo electrode ink. However, the presence of such occasional pillars does not materially affect the ability of the dielectric layers to shift relative to each other in a direction normal to the plane of such layers, and the constraint against such expansion engendered by such occasional pillars is minimal.

PROCESS DESCRIPTION DETAILS

In order to comply with the "best mode" requirements of the Patent Laws there will be hereinafter described details of the formulations and handling steps employed in the fabrication of the actuators in accordance with the invention. It should, however, be noted that the process is carried out utilizing materials all of which are well known in the prior art including specifically the dielectric formulations and methods of processing same, the pseudo ink formuations, the elecctroding ink formulations, and the termination formulations and mode of application. By way of example and without limitation a preferred method is practiced as follows:

A. DIELECTRIC MATERIAL

A dielectric material mass was formulated as follows (all figures being given by way of percentage weight):
68.2% Lead Oxide (PbO)
27.4% Columbite ($MgNb_2O_6$)
1.2% Barium Carbonate ($BaCO_3$) (Binder)
3.4% Titania ($TiO_2$) (Binder).

The ingredients are mixed and milled to an average particle size of 1 micron, and blended with a solvent and binder formulation comprised as follows:
1.75% Fish Oil
12.93% Xylene
8.24% Ethanol
2.44% Poly-vinyl Butyrol
2.71% UCON-2000 (Union Carbide)
2.25% PX-316 (Aristec).

The organic carrier system hereinabove described is merely representative and may be varied as is known in the art. The particulate materials and binder system are mixed to form a viscous liquid composition the viscosity of which may be varied in accordance with the thickness of the tape to be cast. A tape is cast on a belt running under a doctor blade or blades to a thickness of substantially 8 mils. After excess solvents are evaporated the tape is imprinted with the pattern as described utilizing electrode inks and pseudo inks. The composition of the respective inks is not critical a suitable electroding ink being identified as number RW 301 which is obtained from the Johnson-Matthey Corporation.

A suitable pseudo ink or fugitive ink is formulated as set forth in above referenced U.S. Pat. No. 3,679,950. A suitable pseudo ink may be formed from a squeegee medium prepared by mixing 80 mililiters of pine oil, 14 grams of acrylic resin and 1.5 grams of lecithin. 16 grams of this mixture are blended with 12 grams of the calcined ceramic formulation set forth above (average particle size of about 4 microns), 4 grams of carbon black, and 1.5 grams of ethyl cellulose. Cap Stoddard solvent or equivalent is added until a viscosity suitable for printing is achieved.

The fabrication procedures are conventional and involve application of electrode ink through a mesh screen patterned in accordance with the size and positioning of the multiple electrode areas. The electrode ink is allowed to dry and the sheet in overprinted using a mask which is the negative of the mask employed to lay down the electrode ink.

A number of sheets each carrying a multiplicity of imprinted areas are stacked in registry and the stack is laminated at about 65° C., at about 1500 pounds per square inch. The stack is removed from the press and allowed to cool Thereafter the stack is diced so as to form from the stacked series of large sheets a multiplicity of individual green actuators as shown in FIG. 2 hereof. The individual units are separated and subjected to a burnout cycle consisting of 24 hour exposure at a progressively increasing temperature, the maximum temperature being 500° C. The parts are fired in a sintering kiln at a maximum temperature of 1150° C. for three hours.

The end surfaces of the parts, after cooling, are terminated with any of a series of conventional silver-glass frit compositions. A representative suitable composition may be identified as Dupont 6134 the frit being thereafter fired in a belt furnace through an approximately half hour cycle, three minutes of such cycle being at the maximum temperature of 750° C. The finished actuators thereafter have a lead soldered thereto or may be solder coated depended upon their intended end use and configuration. The actuators may be further processed as by encapsulation in an epoxy or elastomeric matrix again depending upon whether the end product is to be used as a capacitor or actuator.

Alternate terminations such as conductive polymers or elastomers may be used where extreme expansion or frequent cycling is anticipated.

As will be apparent from the preceding detailed description of a specific embodiment, the selection of formulations for the dielectric, the electrode ink or paste, the fugitive "pseudo-electrode" ink, and the termination materials, as well as the mode of processing the same are all well known in the art. The invention hereof is considered to reside in the concept of employing the combination of an electroding ink and a pseudo electroding ink in such manner as to provide a monolithic device wherein electrodes of opposite polarity exit from difference surfaces of the monolith, wherein voids are present between electrodes of like polarity, and wherein the dielectric layers are essentially unconnected one to the other the sole significant junction between such layers being the areas linked by the electrodes.

As will be apparent from the preceding description, numerous variations in details of geometry, formulation and structure will occur to those skilled in the art and familiarized with the instant disclosure. Accordingly, the invention is to be broadly construed within the scope of the appended claims.

I claim:

1. The method of manufacturing a multilayer ceramic actuator or capacitor comprising the steps of providing a plurality of equal size green ceramic sheets, covering a surface of such sheets with a coating comprising discreet areas of electrode forming and pseudo electrode ink, said electrode ink areas extending to at least a first margin of said sheets and said pseudo electrode ink areas extending to at least a second margin of said sheets, forming a stack of a plurality of said sheets such that said first margins of alternate layers are exposed at a first surface of said stack and said first margins of the layers intervening between said alternate layers are exposed at a second surface of said stack, said second margins being interposed at said surfaces between said first margins, thereafter heating and sintering said stack, and thereafter applying conductive terminations to said first and second surfaces respectively.

2. The method in accordance with claim 1 when said pseudo ink comprises materials subject to volitilization responsive to said heating step to thereby provide substantially void areas between said layers in the areas formerly occupied by said pseudo ink areas.

3. The method in accordance with claim 2 and including the step of introducing insulative material into said void areas adjacent said first and second surfaces in advance of applying said conductive terminations to said surfaces.

4. The method of claim 2 wherein said sheets are generally rectangular in plan and said areas of said pseudo electrode ink extend to three margins of said sheets.

5. As a new article of manufacture a preform for the manufacture of a ceramic actuator or capacitor comprising a stack of a plurality of equal size green ceramic sheets, a first surface area of said sheets being coated with electrode forming material extending to a first margin of said sheets, remaining areas of said surface being coated with pseudo electrode ink, said pseudo ink areas extending to at least a second margin of said sheets, said sheets being arranged in said stack such that said first margins of alternate sheets are exposed at a first surface of said stack and said first margins of the layers intervening between said alternate layers are exposed at a second surface of said stack, said second margins being interposed between said first margins of said surfaces.

6. The article of claim 5 wherein said areas of said pseudo ink extend to all margins of said sheets except said first margins.

* * * * *